INVENTORS
James R. Cricchi &
Francis Rachal
BY John L. Wiegreffe
ATTORNEY

United States Patent Office 3,427,559
Patented Feb. 11, 1969

3,427,559
TUNABLE SIGNAL TRANSLATION SYSTEM USING SEMICONDUCTOR DRIFT FIELD DELAY LINE

James R. Cricchi and Francis Rachal, Baltimore, Md., assignors to Westinghouse Electric Corporation, Pittsburgh, Pa., a corporation of Pennsylvania Filed Aug. 26, 1966, Ser. No. 575,395
U.S. Cl. 330—21 4 Claims
Int. Cl. H03f 3/04, 1/38, 3/14

ABSTRACT OF THE DISCLOSURE

Frequency selective signal translation apparatus having a grounded emitter, phase-inverting electronic amplifier such as a grounded emitter transistor, and an impedance matching device connected in a regenerative feedback loop to the input including a transport time delay line in the form of a semiconductor drift line provides a virtual phase shift in addition to the electrical phase shifting in the electronic amplifier in which an injector electrode on the delay line is interposed between two guard conductors or bars, on the delay line surface to reduce the non-linear effects of the forward biased injector on the drift field.

This invention relates to signal translation systems and particularly to frequency selective circuits which can be used as amplifiers or oscillators.

In copending application Ser. No. 455,241, filed May 12, 1965, and now Patent No. 3,361,984 granted on Jan. 2, 1968, in the name of Irving F. Barditch, John D. Dzymanski and Edward L. Fogle for signal translation system and assigned to the assignee of this application, there is described and claimed a selective signal translation system in which frequency selectivity, or tuning, is accomplished by utilizing the transport time interval required for electrical signals to be propagated through signal delay means, to effect virtual electrical phase shift. Thus, a signal introduced at one point in a system will have a determinable finite transit time associated with a finite travel time of charge carriers. When the signal delay means having the proper transport time interval is incorporated into a feedback loop, regenerative effects for selected bands of frequencies can be produced to thereby provide frequency selective circuits without utilizing inductive elements or RC networks.

In one embodiment of that application, a semiconductor delay line is used in conjunction with semiconductor transistor devices so that the frequency selective circuit can be completely molecularized.

The primary object of the present invention is to provide an improvement of the embodiment of that application utilizing the semiconductor delay line. Such delay lines utilize a variable electric drift field to control the velocity of the charge carriers and thus provide a variable signal transport delay and resulting tuning adjustment. Without any other disturbing influences the velocity of the charge carriers is a linear function of the applied voltage which determines the electric drift field, since the carrier velocity is a function of the product of the mobility of the carriers times the electric field. However, in the signal translation system utilizing the controllable drift velocity of charge carriers by an applied voltage, it is found that the impressed electric drift field interacts with the feedback signals with the result that the charge transport velocity, or frequency tuning effect, does not bear a linear relation to the applied drift voltage. This results in certain distortion of the signal and also provides an undesirable adjustment factor.

Another object of this invention is to provide means for correcting this non-linear relation between the drift voltage and the frequency control characteristics.

Another object is to provide an electronically tunable signal translation system which incorporates an improved semiconductor delay line.

A still further object is to provide an electronically tunable signal translation system which incorporates an improved semiconductor delay line having planar diffused junctions.

Other and further objects will be apparent from the following description when considered in connection with the accompanying drawings in which.

Figure 1:
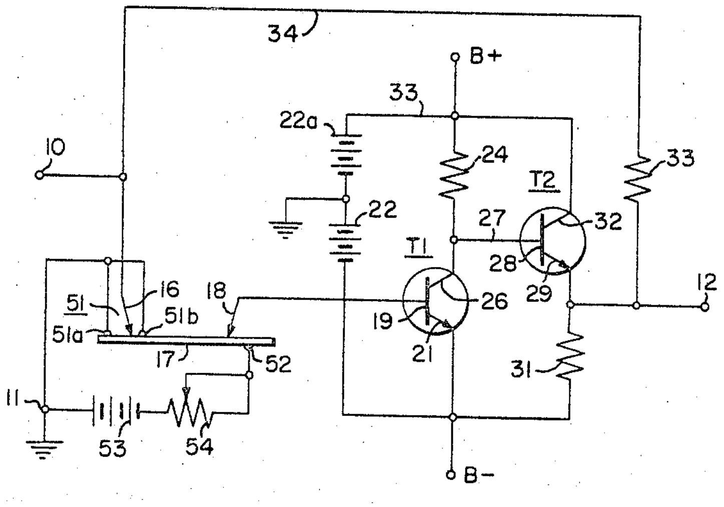
FIGURE 1 is a diagram of the electronically tunable signal translation system in accordance with the present invention.

Fundamentally, the present invention provides an improved electronically tunable signal translation system utilizing a semiconductor delay line in a feedback loop around an inverting amplifier. The charge transport delay in the delay line provides a signal time delay corresponding to the equivalent of an electrical phase shift which, when added to the phase shift of the inverting amplifier, provides regenerative feedback for a selected frequency band. This provides the band pass characteristic. The invention also includes an improved semiconductor delay line.

The particular improvements of this invention relate to the fabrication and arrangement of the delay line so that there is no phase shift or transport relay in the feedback loop, outside of the inverting amplifier, other than the phase shift of the delay line that changes with frequency, to thereby eliminate non-linearity in the frequency-versus-control voltage characteristic. This means the minimizing of stray capacitances of all parts of the circuitry. The delay line is so constructed as to provide a linear relation between the control voltage and the frequency in which the total phase shift in the feedback loop is 360 degrees for the selected frequency band.

The nature of this invention is such that it is believed that a clearer understanding thereof will be facilitated by first describing the basic operation of the invention along with its circuitry before describing the details of the improvement. To this end, reference is made to FIG. 1 in which like reference characters are used throughout to designate like parts and where 10 indicates an input terminal for the signal to be amplified. It is to be understood, of course, that the input signal would be applied between the terminal 10 and grounded terminal 11. The output of the system would be between output terminal 12 and common ground.

The input terminal 10 is connected to an injector electrode, or emitter 16, which has a rectifying contact with a filamentary body of semiconductor material 17 which is included in the feedback loop of a two-stage transistor signal translation system including the transistors T1 and T2. The body of semiconductor material is preferably of N-type silicon. A suitable collector electrode 18 on the semiconductor body 17 is connected to the base 19 of the transistor T1 which is connected in a common emitter configuration. The emitter 21 may be connected directly to the negative terminal of a source of DC potential, such as the battery 22, and the positive terminal of the battery is connected to ground. A battery 22*a* has its negative terminal connected to ground and has its positive terminal connected through lead 23 and resistor 24 to the collector 26 of the transistor T1. The collector 26 of the transistor T1 is connected by a lead 27 to the base 28 of transistor T2 which is connected as an emitter follower to serve as isolating means and as impedance matching means to match the output of the output transistor T1 to the feedback loop and the delay line 17. The emitter of the transistor T2 is connected through the emitter resistor 31 to the emitter 21 of transistor T1 and the negative terminal of battery 22. The collector 32 is energized from the positive terminal of the battery 22*a*. The emitter 29 is also connected through the resistor 33 and lead 34 back to the input terminal 10 and the injector emitter 16 to complete the feedback loop.

The filamentary semiconductor body 17, constituting the signal transport delay line, is provided with ohmic contacts 51 and 52 at their respective opposite ends across which there is applied a variable voltage from a battery 53, the positive terminal of which is grounded. The variable voltage applied between the contacts 51 and 52, which determines the internal drift field and thus the charge carrier drift velocity, is controlled by a rheostat 54 in the negative lead. The voltage applied to ohmic contacts 51 and 52 is that used to tune the amplifier, that is, change the frequency of the pass band.

So far, reference is to contact 51 as being singular in the sense of it being a potential point. However, as shown later, it is a "distributed" point constructed to maintain a zero potential gradient zone around the injector emitter 16.

Although the role of the semiconductor delay line 17 will probably be apparent to those skilled in the art from the foregoing description, the following description will facilitate an understanding on this point and explain the general operation.

It is known that the conductivity in semiconductor materials, such as germanium, silicon and certain other materials, involves transport or movement of majority and minority characters, otherwise known as electrons or holes. The type of carriers normally in excess in the material due to a doping impurity, known as the majority carriers, determines the conductivity type of the material, i.e., N- or P-type.

For example, in N-type semiconductors, the majority carriers are electrons, whereas in P-type semiconductors the majority, or excess carriers, are holes. An increase in the number of carriers at any given region in a semiconductor material results in an increase in the conductivity at that region and conversely a decrease in the number of carriers at that region causes a decrease in the conductivity at that region. The flow of minority carrier through a semiconductor material is characterized by transit times of substantial magnitude for practical purposes. The minority carrier transport velocity is a function of the electric field applied to the semiconductor body and the minority carrier mobility in that semiconductor. The signal propagation by minority carrier transport is substantially below the velocity of light, while signal propagation due to majority carriers is substantially the velocity of light.

From the general knowledge of transistors, it is well known that carriers of the type opposite that of the carriers normally in excess in a semiconductor body (minority carriers) can be injected into the semiconductor body by way of a forwardly biased rectifying junction on the body and can be caused to drift or diffuse toward an appropriately biased second rectifying junction on the semiconductor body. In the present instance, the injector electrode 16 has a rectifying junction within the body of the N-type semiconductor material 17 and this constitutes the emitter of the semiconductor delay line. Similarly, the collector electrode 18 has a rectifying junction within the semiconductor body 17 and minority carriers will be collected by it. The drift velocity or transport velocity of the minority carriers injected into the body 17 will be dependent upon the voltage applied to the ohmic contacts 51 and 52. Here it should be remembered that the level of injection of minority carriers will also vary the conductivity of the material. It is this effect that must be reduced to a minimum for linear frequency control.

As will be apparent from the following description, this variation of conductivity gives rise to problems in this type of signal translation system since the feedback voltage is superimposed on the same region of the semiconductor body on which the drift field is applied and this has a tendency to modulate the conductivity of the material.

This destroys the linear frequency-versus-applied voltage relation. It is desired to have the feedback signal supplied to the emitter 16 and be delivered to the base of the first transistor T1 through the delay line 17 without effecting the conductivity of the latter.

The problem solved by the present invention can be simply and best illustrated by reviewing fundamentals of semiconductor physics which are particularly pertinent to the present invention.

Figure 4:
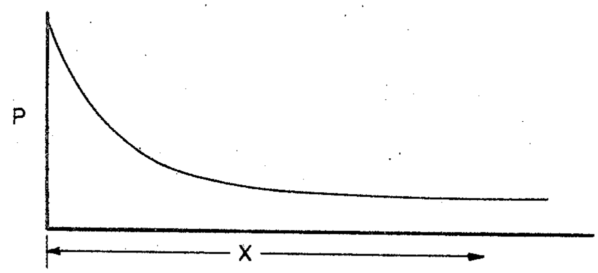
FIG. 4 is a graph showing the minority carrier concentration as a function of the distance X from a P-N junction in a semiconductor device.

Referring to FIG. 4, when a P-N junction is forward biased, such as in the case of the P-N junction of emitter 16, the forward current is carried by particles which are minority carriers after they have crossed the junction. Near the junction these particles carry the current by diffusion along the minority carrier concentration gradients which vary, generally, as graphically illustrated in this figure. This concentration gradient is altered by the application of an electric drift field. Further away from the junction, the current is carried by the majority particles.

Figure 5:
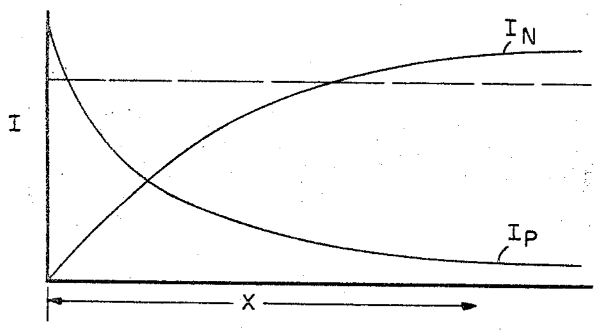
FIG. 5 is a graph showing the two components of current, $I_P$ and $I_N$, due to positive hole and negative electron carriers, respectively, as a function of distance X from a P-N junction in a semiconductor device.

It is well understood that the total current through a semiconductor junction is a function of the carrier concentration, and is equal to the sum of the hole current and electron current. That is, $$I_t = I_N + I_P$$

where $I_N$ is the electron current and $I_P$ is the hole current. The variation of these two types of currents as a function of distance from the junction is graphically illustrated in FIG. 5.

Where the two regions of the junction are unevenly doped, as is the usual case in semiconductor devices, the junction forward current is carried almost entirely as diffusion current of minority carriers. This is seen in FIG. 5 where zero of the graph is at the barrier interface and it will be noted that the hole current $I_P$ decreases exponentially as the electron current $I_N$ increases exponentially. The diffusion current of the positive holes diffuse under the barrier and thereafter diffuse down the positive hole gradient to the right. As these particles diffuse, their concentration is reduced by recombination and the gradient becomes smaller. As the distance from the junction barrier increases to the right in FIG. 5, more and more of the current is carried by electrons moving from right to left. These majority carriers move in toward the barrier to take the place of those which have recombined.

Figure 2:
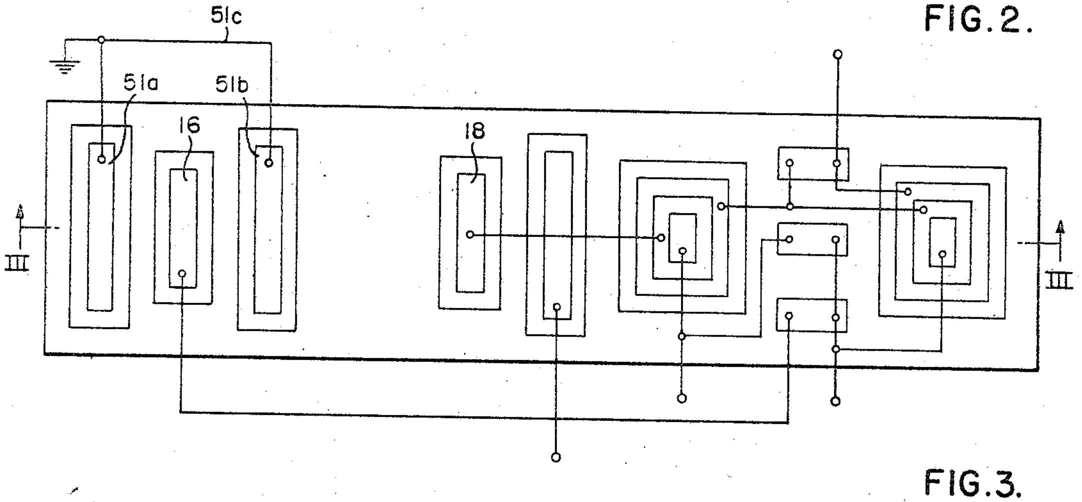
FIG. 2 is a plan view of one embodiment of the present invention.
Figure 3:
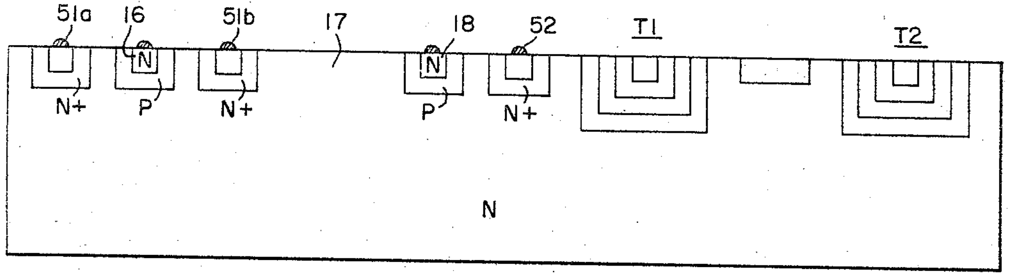
FIG. 3 is a longitudinal sectional view of FIG. 2 of a line III—III looking in the direction of the arrows.

The semiconductor delay line 17 of FIGS. 1, 2 and 3, for purpose of analysis, may be considered as a semiconductor triode in which the body of the delay line is analogous to the base of a transistor which is much longer than in those used for conventional amplifiers and the spacing between emitter and collector is much greater.

In the graphs of FIG. 4 and FIG. 5, it was assumed that there was no collector. It is will understood that the current carrier mechanism in semiconductors is modified by the presence of a nearby reversed-biased collector junction as in a transistor or as in the semiconductor delay line here.

Figure 6:
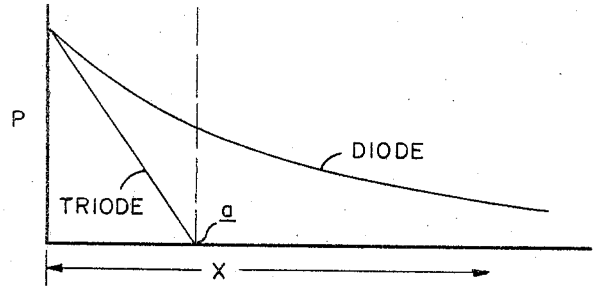
FIG. 6 is a graph illustrating the effect of a nearby reverse-biased collector on the minority carrier concentration illustrated in FIG. 4.

FIG. 6 illustrates how the current carrying mechanism for a semiconductor diode, as illustrated in FIG. 5, is modified by the addition of a collector, such as collector 18, making the device a triode. A reverse-biased collector junction acts as an infinite sink for minority particles which diffuse into it across the base layer. Such a collector removes the minority particles from the base of the emitter junction faster than they diffuse away if the collecter were not there. This removal by the collector therefore results in a higher concentration gradient of minority carriers across the base layer and hence in a higher velocity of minority carriers across the base region than for that corresponding to a diode.

In FIG. 6, the vertical coordinate is the concentration of emitted positive holes and the top solid curve gives the positive hole concentration as a function of distance which may be considered to correspond to the injector emitter 16, from the junction for the diode, as compared to the corresponding function for a triode, indicated by the lower curve. Since the reverse-biased collector junction of a triode acts like an infinite sink for minority carriers which diffuse into it across the base the electron current in the triode case is much larger than for the diode case. In the graph the emitter junction may be considered to be at zero and the collector junction of the triode at $X=a$.

When excess minority carriers are injected into a semiconductor region, such as at the injector emitter 16 they do not live very long. The semiconductor material attempts to maintain a balance again and recombination takes place. There are many different modes of recombination but, in general, an electron and hole come together to produce a stable state. The process usually involves the release of energy. Then the only current present is electron current. The velocity of electron current, that is, majority carrier current is fixed by nature and does not enter into the tuning function.

Since holes have a finite lifetime, the carrier concentration is a function of time as well as the distance from the junction as previously illustrated. The velocity of the positive holes, on the other hand is $$v=\mu\epsilon+v_{diff} \quad (1)$$

where $\mu$ is the mobility, $\epsilon$ is the strength of the electric field, and $v_{diff}$ is the diffusion velocity of the minority carriers. The diffusion velocity is dependent on the concentration gradient.

Figure 7:
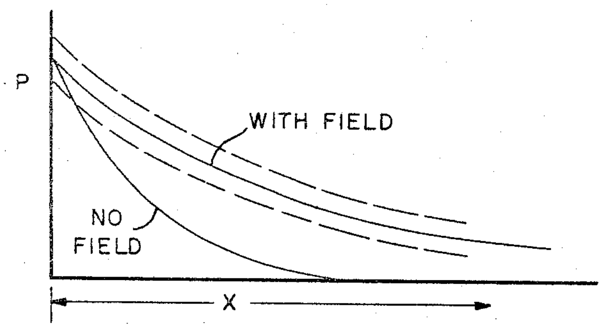
FIG. 7 is a graph illustrating by the dotted curves that a change in the voltage on the reverse-biased collector will change the position and the shape of the carrier concentration curve.

Accordingly, as illustrated in FIG. 7, at the end of any given time interval the hole concentration will be greater at any given distance from the emitter junction when there is a field than when no field is present. This means in the present situation that a change in the drift voltage between terminals 51 and 52 can change the shape or position of the carrier concentration curves of FIG. 7, and also consequently change the transit time for a signal, injected at the emitter 16, to travel to the collector 18. It also means that a variation in the voltage on the injector emitter 16, such as that due to the feedback signal amplitude, will modulate the starting point of the curves indicated by the dashed curves of FIG. 7, producing a similar result.

It has been stated above that the primary objectives of the present invention is to provide a linear relation between the frequency and the value of the drift field voltage. In order to get this linear relation, it is necessary to avoid modulation of the conductivity of the delay line 17. The conductivity $\sigma$ of a semiconductor is $$\sigma=N\mu_n\epsilon+p\mu_p\epsilon \quad (2)$$

where N is the number of electrons in the upper band; $\mu_n$ is the mobility of the electrons in cm.$^2$/v. sec.; $\mu_p$ is the mobility of the positive holes in cm.$^2$/v. sec.; and $\epsilon$ is the magnitude of the drift field.

Referring back to FIG. 7, it will be seen that an increase or decrease in the drift field or an increase or decrease in the holes injected will cause an increase or decrease in the number of holes swept to the right toward the collector 18. An increase in the population of the positive holes reduces the resistance, that is, increases the conductivity.

From Equation 2 it is readily apparent that the conductivity of the delay line 17, among other factors, is a function of both the number of electrons and the number of positive holes and the electric field. It is desired that the conductivity not change significantly with the drift field applied between terminals 51 and 52. Also it is desired that it not be substantially changed by changes of the feedback voltage supplied to the injector emitter 16. Since the effect of large changes in the emitter voltage has the effect of modulating the carrier concentration distribution curve of FIG. 4 up and down and accordingly changing the current curves of FIG. 5 it also has the effect of producing a non-linear drift field between the terminals 51 and 52.

By making the drift voltage terminal 51 in the form of two diffusion bars **51*a* and 51*b* one on either side of the injector emitter 16 connected by a solid metal conductor 51*c* the effect of the drift field voltage from battery 53 upon the positive holes that are injected into the N-type region of the delay line is minimized and therefore hole population is kept low. The ohmic contact bars 51*a* and 51*b* establish a zero potential zone around the emitter 16. Since the bars 51*a* and 51*b* are at the same potential their effect is similar to that graphically illustrated in FIG. 6. Accordingly, change in the conductivity between terminals 51 and 52** due to the holes injected across the P-N of the injector emitter will be greatly reduced. This can be graphically illustrated as in FIG. 8.

Figure 8:
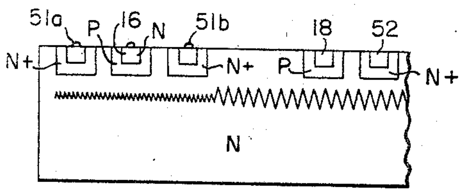
FIG. 8 is a schematic representation of the resistance components in the semiconductor delay line of the present invention.

In FIG. 8, the total resistance between terminals 51 and 52 may be represented by a resistor having two sections R1 and R2; the small section R1 symbolizing the cloud of positive holes in the immediate vicinity of the emitter 16 while the majority carrier electrons and the few holes which reach the collector 18 are represented by the larger section R2. This is intended to represent the fact that the total IR drop through the body of the delay line 17 is due primarily to the flow of the majority carriers and therefore the total conductivity of the line is substantially unaffected by the injected holes. As will be seen from the subsequent description of FIGS. 2 and 3, the present invention provides means for accomplishing this end result.

In the case where N-type material is used, holes are injected into the semiconductor delay line 17 with the current flowing in the easy flow direction at the emitter 16. The holes moving through the body of the delay line flow to the vicinity of the collector 18 where they recombine with electrons at that point. The transport or drift velocity of the minority carriers is determined by the electric field in the body of the semiconductor which in turn is determined by the voltage applied to the ohmic contacts 51 and 52. In silicon, for example, transport delay times as long as 100 $\mu$sec. have been obtained in delay lines about 150 mils long with an applied drift voltage of about 10 volts. Doping may also be used to supplement the applied electric field needed to produce a fixed drift velocity. The distance between the injector emitter and the collector 16 and 18, respectively, of the semiconductor delay line 17, is so related to the doping and the magnitude of the drift field as to produce the regenerative feedback action for the selected band of frequencies. The low leakage current of the diffused planar emitter junction 16 and the collector junction in silicon makes it possible to detect the very small variations in the minority carrier current at the collector. The diffusion is made through a protective oxide mask.

Since the transistor collector output impedance is very high relative to the input impedance at the injector emitter 16, the emitter follower transisor 2 is inserted in the feedback loop between the collector of the inverting amplifier T1. As a result of this arrangement, with the proper adjustments "on-frequency" signals will be reinforced while "off-frequency" signals will be greatly reduced. By controlling the gain of the amplifier so that its gain is greater than the losses of the delay line, it will be apparent that the system will be operated as an oscillator. Similarly, if the gain of the system is adjusted below unity gain the system will operate as a band pass filter while the control of the drift field will control the frequency of operation. Obviously, when the device is operated as an oscillator, no signal is supplied through the input terminal 10.

We claim as our invention:

1. A signal transport delay device for use in a tunable signal translation system comprising:

(a) an elongated semiconductor body constituting a delay line;

(b) an injector emitter having a rectifying junction with said semiconductor body;

(c) a collector electrode having a P-N junction with said body at a point remote from said emitter;

(d) means for establishing a flow of carriers between said emitter and said collector including a pair of ohmic contacts on said body and spaced farther apart than and outwardly of said emitter and said collector, respectively, so that a voltage applied between said ohmic contacts will establish a drift field between said emitter and said collector, and (e) a second ohmic contact on said body adjacent said emitter and between the latter and said collector electrically connected to the other said ohmic contact adjacent said emitter for establishing a zero potential gradient in the vicinity of said emitter.

2. The combination as set forth in claim 1 in which said ohmic contact between said emitter and said collector is an elongated bar.

3. The combination as set forth in claim 1 in which said ohmic contacts adjacent said emitter are elongated bars.

4. A tunable signal translation system comprising input and output means; circuit means including a signal transport delay means, as set forth in claim 6, and first and second transistor means connected between said input and output means; said first transistor means being connected in a grounded emitter configuration and having its input connected to said input means, said second transistor means being connected in an emitter follower configuration and having its base-emitter junction included in series with said delay means and the collector output of said first transistor means in said circuit means between said input and said output means, said first transistor means providing a phase shift of all input frequencies by an amount due to the electrical phase relations between the input on the base and the output on the collector, said signal delay means providing a signal delay corresponding to a phase shift of substantially 180° for a selected band of frequencies for providing regenerative feedback for said selected band of frequencies, and said ohmic contacts adjacent said emitter reducing the effect of feedback signals upon the conductivity of said semiconductor body delay line.

References Cited

UNITED STATES PATENTS

| | | | |
|---|---|---|---|
| 2,600,500 | 6/1952 | Haynes et al. | 330—31 X |
| 3,358,197 | 12/1967 | Scarlett | 317—235 |
| 3,361,984 | 1/1968 | Barditch et al. | 330—31 |

JOHN KOMINSKY, *Primary Examiner.*

JAMES B. MULLINS, *Assistant Examiner.*

U.S. Cl. X.R.

307—300, 303; 317—235; 330—26, 31, 38